(12) United States Patent
Süle et al.

(10) Patent No.: US 12,316,007 B2
(45) Date of Patent: May 27, 2025

(54) FEEDING CIRCUIT LAYOUT FOR 4 X 4 LINEAR AoX ARRAYS

(71) Applicant: Silicon Laboratories Inc., Austin, TX (US)

(72) Inventors: Ádám Süle, Budapest (HU); Attila Zólomy, Budapest (HU); Szabolcs Lőrincz, Vamosmikola (HU); Terry Lee Dickey, Pflugerville, TX (US)

(73) Assignee: Silicon Laboratories Inc., Austin, TX (US)

( * ) Notice: Subject to any disclaimer, the term of this patent is extended or adjusted under 35 U.S.C. 154(b) by 537 days.

(21) Appl. No.: 17/830,548

(22) Filed: Jun. 2, 2022

(65) Prior Publication Data

US 2022/0416440 A1    Dec. 29, 2022

Related U.S. Application Data

(63) Continuation-in-part of application No. 17/356,766, filed on Jun. 24, 2021, now Pat. No. 12,113,288.

(51) Int. Cl.
*H01Q 21/06* (2006.01)
*H01Q 1/48* (2006.01)
(Continued)

(52) U.S. Cl.
CPC ............ *H01Q 21/065* (2013.01); *H01Q 1/48* (2013.01); *H01Q 21/0006* (2013.01);
(Continued)

(58) Field of Classification Search
CPC .......... H01Q 1/48; H01Q 1/523; H01Q 1/526; H01Q 15/006; H01Q 15/0086;
(Continued)

(56) References Cited

U.S. PATENT DOCUMENTS

| 12,113,288 B2 | 10/2024 | Dickey et al. |
| 2013/0088391 A1 | 4/2013 | Corman et al. |

(Continued)

FOREIGN PATENT DOCUMENTS

| CN | 103268980 A | 8/2013 |
| CN | 116917770 A | 10/2023 |

OTHER PUBLICATIONS

Final Rejection mailed Dec. 19, 2023 in co-pending U.S. Appl. No. 17/356,766.
(Continued)

*Primary Examiner* — Daniel Munoz
(74) *Attorney, Agent, or Firm* — Nields, Lemack & Frame, LLC

(57) ABSTRACT

A printed circuit board having an AoX antenna array and a feeding circuit is disclosed. The AoX antenna array has patch antenna disposed on a top layer of the printed circuit board, while the feeding circuit is disposed on the bottom layer. The signal traces that connect the ports of the antenna unit cells to the antenna selection switches are routed so that all are roughly equal in length with a minimal length of parallel sections between signal traces. Thus, the signal traces in the feeding circuit are created so as to minimize phase difference between signal traces and to minimize coupling. Coplanar waveguides, which utilize blind vias are used to further reduce coupling.

11 Claims, 14 Drawing Sheets

(51) Int. Cl.
*H01Q 21/00* (2006.01)
*H05K 1/02* (2006.01)

(52) U.S. Cl.
CPC ........... *H05K 1/0243* (2013.01); *H05K 1/025* (2013.01); *H05K 2201/10098* (2013.01)

(58) Field of Classification Search
CPC .. H01Q 21/0006; H01Q 21/065; H01Q 21/26; H05K 1/0243; H05K 1/025; H05K 2201/10098
See application file for complete search history.

(56) References Cited

U.S. PATENT DOCUMENTS

| | | | |
|---|---|---|---|
| 2020/0284883 A1 | 9/2020 | Ferreira et al. | |
| 2021/0096207 A1 | 4/2021 | Torrini et al. | |
| 2022/0085521 A1* | 3/2022 | Komura | H01Q 23/00 |
| 2022/0291395 A1 | 9/2022 | Iyengar et al. | |
| 2022/0416436 A1* | 12/2022 | Zólomy | H01Q 21/065 |
| 2022/0416445 A1 | 12/2022 | Dickey et al. | |

OTHER PUBLICATIONS

Office Action mailed Aug. 16, 2023 in co-pending U.S. Appl. No. 17/356,766.
Notice of Allowance mailed Aug. 5, 2024 in co-pending U.S. Appl. No. 17/356,766.
Office Action mailed Mar. 22, 2024 in co-pending U.S. Appl. No. 17/356,766.

* cited by examiner

| CIRCULAR | UPPER/ LOWER | ANTENNA SELECT | RESULT |
|---|---|---|---|
| 0 | 0 | 0000 | ANTENNA #2 VERTICAL |
| 0 | 0 | 0001 | ANTENNA #2 HORIZONTAL |
| 0 | 0 | 0010 | ANTENNA #1 VERTICAL |
| 0 | 0 | 0011 | ANTENNA #1 HORIZONTAL |
| 0 | 0 | 0100 | ANTENNA #5 VERTICAL |
| 0 | 0 | 0101 | ANTENNA #5 HORIZONTAL |
| 0 | 0 | 0110 | ANTENNA #9 VERTICAL |
| 0 | 0 | 0111 | ANTENNA #9 HORIZONTAL |
| 0 | 0 | 1000 | ANTENNA #6 VERTICAL |
| 0 | 0 | 1001 | ANTENNA #13 VERTICAL |
| 0 | 0 | 1010 | ANTENNA #8 VERTICAL |
| 0 | 0 | 1011 | ANTENNA #8 HORIZONTAL |
| 0 | 0 | 1100 | ANTENNA #4 VERTICAL |
| 0 | 0 | 1101 | ANTENNA #4 HORIZONTAL |
| 0 | 0 | 1110 | ANTENNA #3 VERTICAL |
| 0 | 0 | 1111 | ANTENNA #3 HORIZONTAL |
| 0 | 1 | 0000 | ANTENNA #11 VERTICAL |
| 0 | 1 | 0001 | ANTENNA #11 HORIZONTAL |
| 0 | 1 | 0010 | ANTENNA #12 HORIZONTAL |
| 0 | 1 | 0011 | ANTENNA #12 VERTICAL |
| 0 | 1 | 0100 | ANTENNA #7 VERTICAL |
| 0 | 1 | 0101 | ANTENNA #7 HORIZONTAL |
| 0 | 1 | 0110 | ANTENNA #10 VERTICAL |
| 0 | 1 | 0111 | ANTENNA #10 HORIZONTAL |
| 0 | 1 | 1000 | ANTENNA #6 HORIZONTAL |
| 0 | 1 | 1001 | ANTENNA #13 HORIZONTAL |
| 0 | 1 | 1010 | ANTENNA #14 VERTICAL |
| 0 | 1 | 1011 | ANTENNA #14 HORIZONTAL |
| 0 | 1 | 1100 | ANTENNA #15 VERTICAL |
| 0 | 1 | 1101 | ANTENNA #15 HORIZONTAL |
| 0 | 1 | 1110 | ANTENNA #16 HORIZONTAL |
| 0 | 1 | 1111 | ANTENNA #16 VERTICAL |
| 1 | X | 1000 | ANTENNA #6 CIRCULAR |
| 1 | X | 1001 | ANTENNA #13 CIRCULAR |
| 1 | X | ALL OTHERS | NOT USED |

*FIG. 6*

| LAYER NAME | TYPE | MATERIAL | THICKNESS (mm) | DIELECTRIC MATERIAL |
|---|---|---|---|---|
| TOP OVERLAY | OVERLAY | | | |
| TOP SOLDER | SOLDER MASK/Co... | SURFACE MATERIAL | 0.01016 | SOLDER RESIST |
| TOP LAYER | SIGNAL | COPPER | 0.035 | |
| DIELECTRIC 1 | DIELECTRIC | CORE | 0.2 | FR4 |
| IM1 RIS | SIGNAL | COPPER | 0.018 | |
| DIELECTRIC 5 | DIELECTRIC | PREPREG | 0.42 | |
| IM2 SIGNAL | SIGNAL | COPPER | 0.018 | |
| DIELECTRIC 4 | DIELECTRIC | CORE | 0.2 | |
| IM3 SIGNAL | SIGNAL | COPPER | 0.018 | |
| DIELECTRIC 3 | DIELECTRIC | PREPREG | 0.42 | |
| IM4 GND | SIGNAL | COPPER | 0.018 | |
| DIELECTRIC 2 | DIELECTRIC | CORE | 0.2 | |
| BOTTOM LAYER | SIGNAL | COPPER | 0.035 | |
| BOTTOM SOLDER | SOLDER MASK/Co... | SURFACE MATERIAL | 0.01016 | SOLDER RESIST |
| BOTTOM OVERLAY | OVERLAY | | | |

FIG. 7

FEEDING CIRCUIT LAYOUT FOR 4 X 4 LINEAR AoX ARRAYS

This application is a continuation in part of U.S. patent application Ser. No. 17/356,766, filed Jun. 24, 2021, the disclosure of which is incorporated by reference in its entirety.

This disclosure describes a feeding circuit for an antenna array, and more particularly a feeding circuit that allows the selection of a particular polarization of an antenna in the antenna array.

BACKGROUND

The explosion of network connected devices has led to an increased use of certain wireless protocols. For example, simple wireless network devices are being implemented as temperature sensors, humidity sensors, pressure sensors, motion sensors, cameras, light sensors, dimmers, light sources, and other functions. Additionally, these wireless network devices have become smaller and smaller.

These wireless network devices are typically equipped with an embedded antenna. In certain embodiments, an antenna array may be required. For example, for Angle of Arrival and Angle of Departure calculations, an antenna array is necessary. In certain embodiments, the array may be a two dimensional array, such as an N×M array, where N and M are both greater than one. In other embodiments, the array may be a one dimensional array, such as N×1 or 1×M, where N and M are greater than one.

There are many design considerations that must be taken into account when designing an antenna array. For example, for accurate directional angle estimations in AoX solutions, well isolated radiator elements are required in the antenna array to reduce the crosstalk between them.

One use for these antenna arrays is Angle of Arrival and Angle of Departure algorithms, collectively referred to as AoX algorithms. These algorithms typically operate by determining a phase difference between different antenna elements in an antenna array. This phase difference can be used to determine the angle from which the signal originated, since the distance between antenna elements is known.

Specifically, assume the distance between two adjacent antenna elements is d. The phase difference between when the incoming signal is detected at these two adjacent antenna elements can be given as $\varphi$. This phase difference, $\varphi$, divided by $2\pi$, multiplied by the wavelength, $\lambda$, represents the distance between the two antenna elements, as viewed from the signal source. Knowing this difference in the distance that the incoming signal travelled allows the angle of arrival to be calculated. Specifically, the angle of arrival can be given by the difference in the distance that the incoming signal travelled, divided by d represents the cosine of the incoming signal. In other words, the angle of arrival is defined as the arc cosine of $(\varphi\lambda/2\pi)/d$.

One algorithm that is commonly used to determine AoX is referred to as MUSIC. This algorithm generates pseudospectrums from the incoming data and estimates the most likely AoX from these pseudospectrums. Many antenna arrays utilize circular polarization during the AoX algorithm. However, this approach may result in larger than desired errors, especially in multipath environments.

Thus, it would be beneficial if there were an antenna array that could be used for AoX algorithms that was small in size. Further, it would be advantageous if it was possible to obtain both horizontal and vertical polarization information from each antenna element. Finally, it would be beneficial if these functions were all contained in a single printed circuit board.

SUMMARY

A printed circuit board having an AoX antenna array and a feeding circuit is disclosed. The AoX antenna array has patch antenna disposed on a top layer of the printed circuit board, while the feeding circuit is disposed on the bottom layer. The signal traces that connect the ports of the antenna unit cells to the antenna selection switches are routed so that all are roughly equal in length with a minimal length of parallel sections between signal traces. Thus, the signal traces in the feeding circuit are created so as to minimize phase difference between signal traces and to minimize coupling. Coplanar waveguides, which utilize blind vias are used to further reduce coupling.

According to one embodiment, a printed circuit board is disclosed. The printed circuit board comprises a top layer; a reactive impedance surface (RIS) layer disposed beneath and adjacent to the top layer; a ground layer; a bottom layer directly adjacent to the ground layer; an antenna array, comprising a plurality of antenna unit cells, each antenna unit cell having a patch antenna disposed on the top layer and one or more metamaterial structures disposed on the RIS layer; and a feeding circuit, comprising one or more antenna selection switches, wherein a first set of signal traces, which are the signal traces from each patch antenna to a respective one of the one or more antenna selection switches, are routed on the bottom layer, and wherein a length of each of the signal traces in the first set of signal traces is within 1.5 mm of each other. In some embodiments, the one or more metamaterial structures comprise hollow square frames. In some embodiments, a distance from the top layer to the RIS layer is equal to a distance from the bottom layer to the ground layer. In certain embodiments, the distance is 0.2 mm. In some embodiments, each antenna unit cell comprises a ground guard ring disposed around a perimeter of the patch antenna; and stitching vias to electrically connect the ground guard ring to the ground layer. In some embodiments, shielding vias are disposed on opposite sides of each of the signal traces in the first set of signal traces. In certain embodiments, the shielding vias are blind vias that only pass from the bottom layer to the ground layer. In some embodiments, the printed circuit board comprises one or more additional layers disposed between the RIS layer and the ground layer.

According to another embodiment, a printed circuit board is disclosed. The printed circuit board comprises a top layer; a ground layer; a bottom layer directly adjacent to the ground layer; an antenna array, comprising a plurality of antenna unit cells, each antenna unit cell having a patch antenna disposed on the top layer; and a feeding circuit, comprising: an upper antenna selection switch and a lower antenna selection switch, wherein a first set of signal traces are used to connect a horizontal polarized signal and a vertical polarized signal of each antenna unit cells; upper polarization switch and a lower polarization switch, wherein a second set of signal traces are used to connect the upper antenna selection switch and the upper polarization switch and to connect the lower antenna selection switch and the lower polarization switch; and a bank selection switch, wherein a third set of signal traces are used to connect the bank selection switch to the upper polarization switch and to the lower polarization switch. In some embodiments, the first set of signal traces are routed on the bottom layer and a length of each signal trace in the first set of signal traces is within 1.5 mm of each other. In some embodiments, one signal trace in the first set of signal traces has a longest length and other signal traces in the first set of signal traces have a tortuous path to achieve the longest length. In some embodiments, parallel sections between adjacent traces in the first set of signal traces are minimized to reduce coupling. In some embodiments, the second set of signal traces are routed on the bottom layer and a length of each signal trace in the second set of signal traces is within 1.5 mm of each other. In some embodiments, the third set of signal traces are routed on the bottom layer and a length of each signal trace in the third set of signal traces is within 1.5 mm of each other. In some embodiments, shielding vias are disposed on each side of the signal traces in the first set of signal traces. In certain embodiments, the shielding vias are blind vias that only pass from the bottom layer to the ground layer. In some embodiments, the feeding circuit further comprises a 90° hybrid, wherein a fourth set of signal traces are used to connect the upper polarization switch and the lower polarization switch to the 90° hybrid. In some embodiments, a length of each signal trace in the fourth set of signal traces is within 3 mm of each other. In certain embodiments, the fourth set of signal traces are routed at least partly on the top layer.

BRIEF DESCRIPTION OF THE DRAWINGS

For a better understanding of the present disclosure, reference is made to the accompanying drawings, in which like elements are referenced with like numerals, and in which:

FIG. 6 shows the various outputs that may be achieved using the switching network of FIG. 5;

FIG. 7 shows a cross-section of the printed circuit board according to one embodiment;

DETAILED DESCRIPTION

The present application describes a printed circuit board that includes a plurality of antenna elements, constructed as antenna unit cells 10, which form an antenna array 1. The printed circuit board also includes the feeding circuit 470 to select one input from the plurality of antenna elements and supply that input to another circuit. This other circuit may be a radio circuit. This radio circuit 31 is used to process the incoming signal and convert the wireless signals to digital signals. The components within the radio circuit 31 are described in more detail below.

The radio circuit includes a low noise amplifier (LNA). The LNA receives a very weak signal from the feeding circuit 470 and amplifies that signal while maintaining the signal-to-noise ratio (SNR) of the incoming signal. The amplified signal is then passed to a mixer. The mixer is also in communication with a local oscillator, which provides two phases to the mixer. The cosine of the frequency may be referred to as $I_o$, while the sine of the frequency may be referred to as $Q_o$. The $I_o$ signal is then multiplied by the incoming signal to create the inphase signal, $I_m$. The $Q_o$ signal is then multiplied by a 90° delayed version of the incoming signal to create the quadrature signal, $Q_m$. The inphase signal, $I_m$, and the quadrature signal, $Q_m$, from the mixer are then fed into programmable gain amplifier (PGA). The PGA amplifies the $I_m$ and $Q_m$ signals by a programmable amount. These amplified signals are referred to as $I_g$ and $Q_g$. The amplified signals, $I_g$ and $Q_g$, are then fed from the PGA into an analog to digital converter (ADC). The ADC converts these analog signals to digital signals, $I_d$ and $Q_d$. These digital signals may pass through channel filter then exit the radio circuit as I and Q. In certain embodiments, the I and Q values may be considered complex numbers, wherein the I value is the real component and the Q value is the imaginary component.

The I and Q signals then enter a CORDIC (Coordination Rotation Digital Computer), which determines the amplitude and phase of the signals. Amplitude is given as the square root of $I^2$ and $Q^2$, while phase is given by the $\tan^{-1}$ (Q/I). The phase is then used by the AoX algorithm.

As noted above, the printed circuit board includes an antenna array 1. The antenna array may be constructed using antenna unit cells, such as those disclosed in U.S. patent application Ser. No. 17/356,853, filed Jun. 24, 2021, the disclosure of which is herein incorporated by reference.

Figure 1:
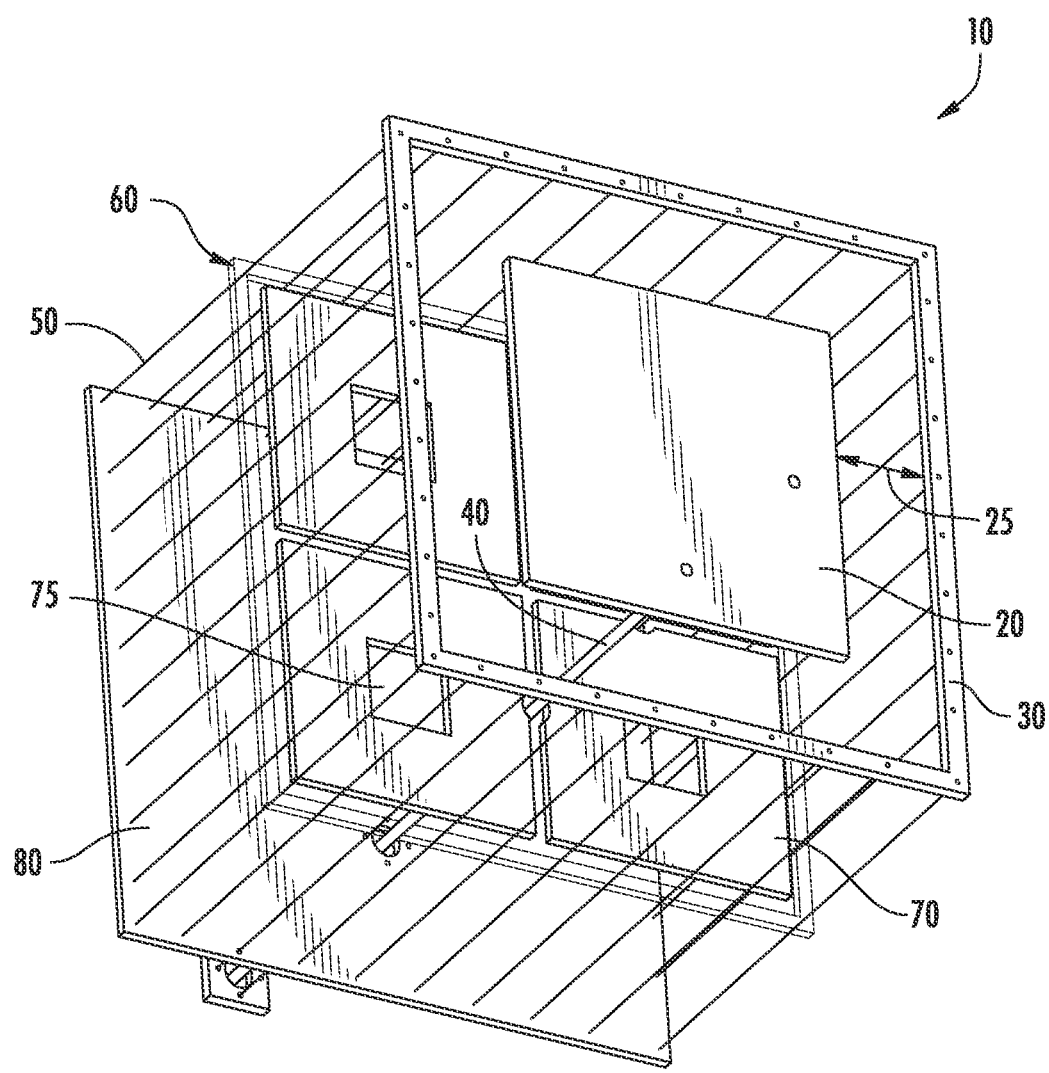
FIG. 1 shows an exploded view of the structure of one antenna unit cell in the antenna array.
Figure 2:
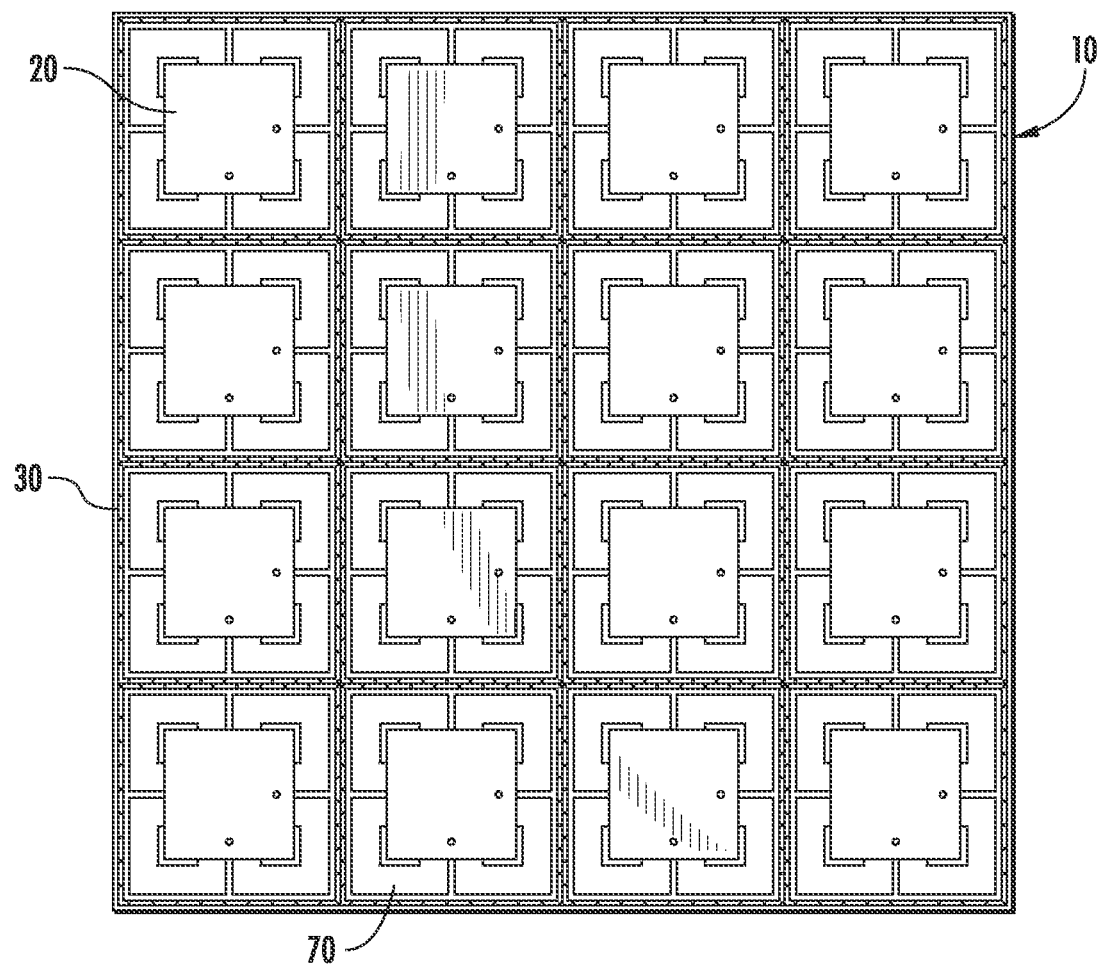
FIG. 2 shows a top view of the antenna array.

FIG. 1 shows an exploded view of one antenna unit cell 10 that may be part of the antenna array 1. These antenna unit cells are also referred to as antenna elements. FIG. 2 shows a top view of the antenna array 1 utilizing a plurality of antenna unit cells 10.

Figure 3:
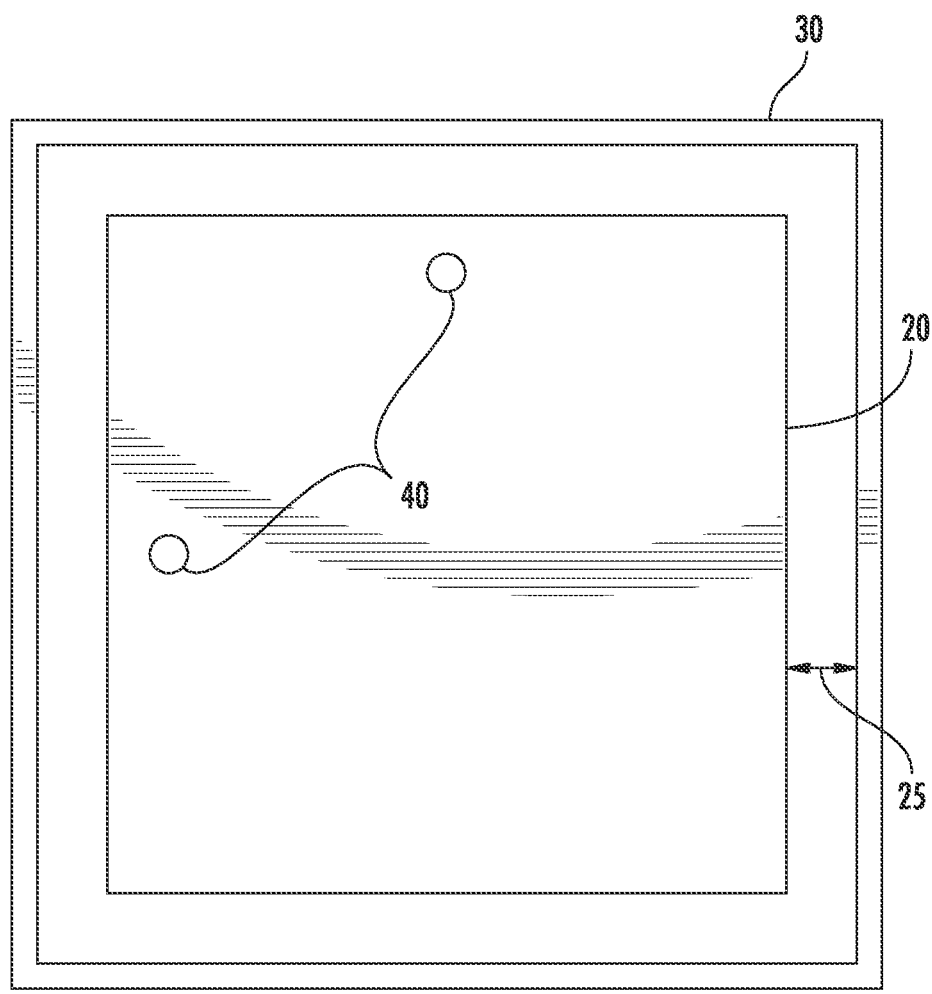
FIG. 3 shows a top view of the patch antenna and ground guard ring.
Figure 4:
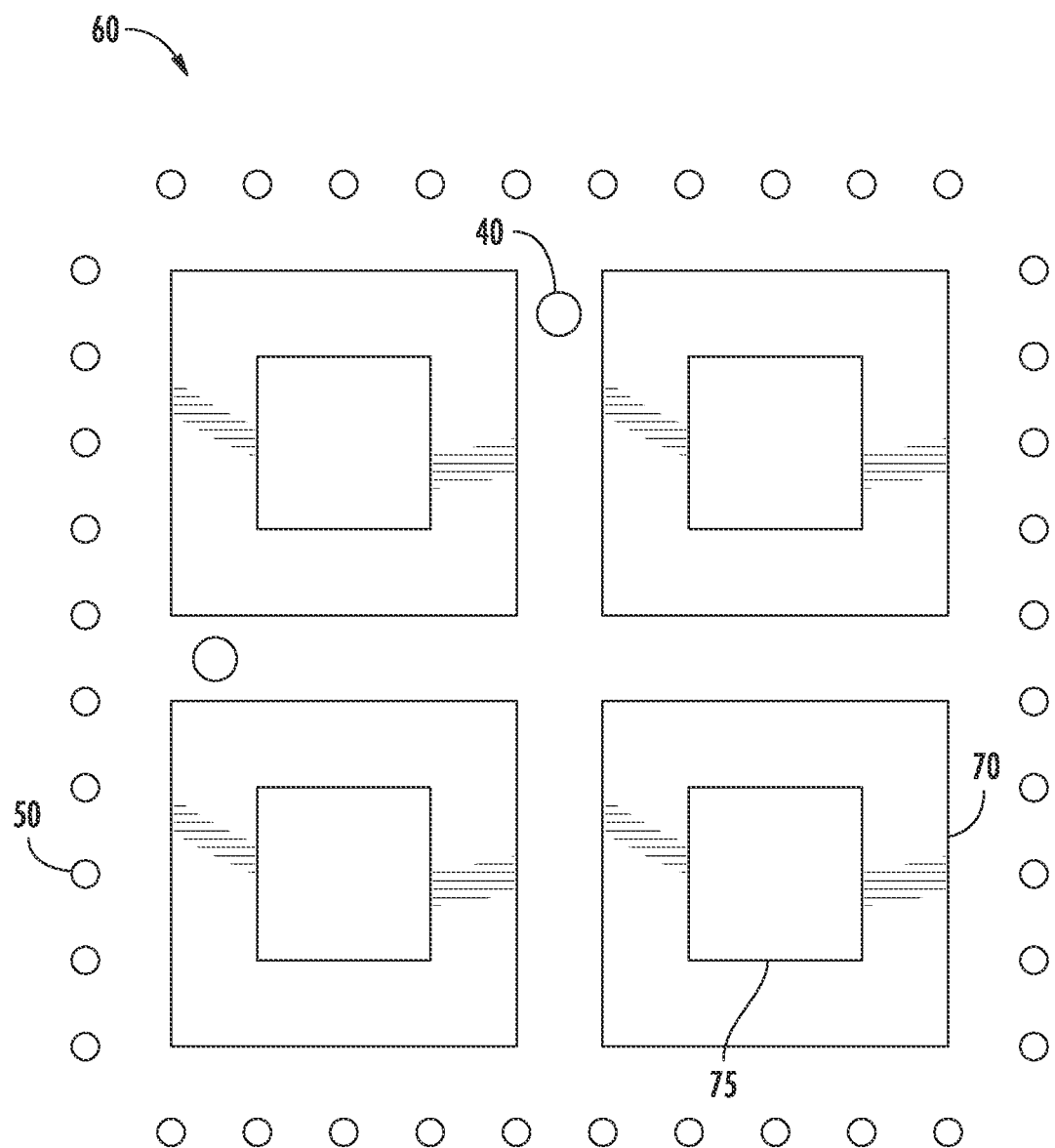
FIG. 4 shows a top view of the RIS layer and metamaterial structures.

As shown in FIG. 1, the structure of the antenna unit cell 10 utilizes three layers of a conventional printed circuit board. Other layers of the printed circuit board may be used to provide power planes, additional ground layers and signal layers. FIG. 3 is a top view of the top surface of the printed circuit board. FIG. 4 is a top view of the RIS layer 60.

The top surface of the printed circuit board is used for the patch antenna 20, while a lower layer is used for the ground layer 80. A reactive impedance surface (RIS) layer 60 is disposed beneath the top surface and above the ground layer 80. In certain embodiments, the RIS layer 60 is the layer immediately adjacent to the top surface. In some embodiments, the ground layer 80 is the layer immediately below the RIS layer 60, such that the top layer, the RIS layer 60 and the ground layer 80 are adjacent.

In other embodiments, there may be one or more intermediate layers between the RIS layer 60 and the ground layer 80, if thicker dielectric is required between them. In certain embodiments, no metal is disposed on these intermediate layers, except another instantiation of the top guard ring.

As stated above, in certain embodiments, a patch antenna 20 is disposed on the top layer of the printed circuit board. The patch antenna 20 may be square such that the patch antenna 20 may be used to receive and transmit both horizontally and vertically polarization signals. In some embodiments, the patch antenna 20 may include slots. The size of the patch antenna 20 is typically defined by the desired resonant frequency, the thickness of the printed circuit board and the dielectric constant of the printed circuit board. In RIS antenna cell structures, additional tuning knobs may include the dielectric thickness between the patch antenna 20 and the RIS layer 60 and between the RIS layer 60 and the ground layer 80. Also, additional tuning knobs are the metamaterial structure frame size and width on the RIS layer.

The patch antenna 20 may be made of copper or another conductive material. The process of creating a plated area on a surface of a printed circuit board is well known.

As best seen in FIG. 3, in certain embodiments, the patch antenna 20 comprises two signal vias 40 which are used to electrically connect the patch antenna 20 to a signal layer or multiple signal layers. All signal layers are situated beneath the ground layer 80. In certain embodiments, the signal vias 40 pass through the ground layer 80 to a signal layer that is disposed beneath the ground layer 80. In certain embodiments, each signal via 40 may be disposed at or near the midpoint of the patch antenna 20 in one direction near an edge of the patch antenna 20. In this way, the patch antenna 20 may be used to transmit and receive horizontally and vertically polarized signals. In embodiments where only one polarization is required, only one signal via 40 may be used. In other embodiments, the one signal via 40 may be situated at the diagonal of the patch to generate circular polarized signal.

A ground guard ring 30 is disposed around the perimeter of the patch antenna 20. In certain embodiments, the ground guard ring 30 may be a hollow square frame, having a thickness of at least the half of the total thickness between the top layer and the ground layer 80. The inner dimension of the ground guard ring is larger than the outer dimension of the patch antenna 20, such that there may be a gap 25 separating the patch antenna 20 from the ground guard ring 30 on all sides. In certain embodiments, the gap 25 may be approximately three times the total thickness between the top layer and the ground layer 80 or higher.

As can be seen in FIG. 1, the ground guard ring 30 is electrically connected to the ground layer 80 using a plurality of stitching vias 50, which are electrically conductive. These stitching vias 50 extend from the top surface to the ground layer 80. In certain embodiments, the distance between adjacent stitching vias 50 may be less than $\lambda/8$, where $\lambda$ is the wavelength of interest.

Beneath the top surface is the RIS layer 60, which is also shown in FIG. 4. The RIS layer 60 comprises a plurality of periodic metamaterial structures 70, shaped so as to realize a reactive impedance for incident electromagnetic waves. Metamaterial is the term given to any material engineered (typically by varying its shape) to provide electromagnetic properties that are not found in the base material. These metamaterial structures 70 may be many different shapes, including a Hilbert fractal inclusion of a second-, third-, or fourth-order, a rectangular spiral, a square spiral, a rectangular ring, or a split ring resonator.

In one particular embodiment, the metamaterial structure 70 may be a hollow square frame, having an outer dimension and an inner dimension that defines a hollow interior portion 75. The width of the frame, defined as one half of the difference between the outer dimension and the inner dimension, may be adjusted to tune the resonant frequency of the metamaterial structure 70. Again, the dimensions of the metamaterial structure 70 may depend on the resonant frequency, the dielectric constant of the printed circuit board, the thickness of the dielectric between the RIS layer 60 and ground layer 80, the thickness of the applied metal, the spacing between the consecutive metamaterial structures and width of the frame of the metamaterial structures 70.

In certain embodiments, the metamaterial structures 70 are sized such that an integral number of these structures may be arranged in the area defined by the ground guard ring 30 on the top surface of the printed circuit board. In certain embodiments, this integral number may be $N^2$, where N is an integer. In other embodiments, this integral number may be N×M, where N and M are integers. In FIG. 1, it can be seen that four metamaterial structures 70 are disposed in the area defined by the ground guard ring 30 on the top surface. However, the disclosure is not limited to this embodiment. Further, as shown in FIG. 4, the stitching vias 50 that connect the ground guard ring 30 to the ground layer 80 may be seen around the perimeter of the metamaterial structures. Additionally, the signal vias 40 are also shown. Note that if N is even, the signal vias 40 may pass between two adjacent metamaterial structures 70.

A top view of the antenna array 1 is shown in FIG. 2. In this figure, there are 16 antenna unit cells 10, arranged as a 4×4 array. Note that the ground guard ring 30 surrounds each patch antenna 20. Further, note that the RIS layer 60 is aligned with the top surface, such that the configuration of the RIS layer 60 in each antenna unit cell 10 is identical. Of course, the antenna array 1 may have an arbitrary number of antenna unit cells, and is not limited to this embodiment. For example, the antenna array 1 may comprise N×M antenna unit cells 10, where at least one of N and M is greater than 1.

While the previous figures show a square patch antenna, the disclosure is not limited to this embodiment. Any radiator (for example any rectangular patch, circular patch, slotted patch, fractal shaped patch, cross dipole, or PIFA) with orthogonal polarized dual fed inputs may be employed.

As noted above, the printed circuit board also includes a feeding circuit 470. The feeding circuit may be constructed using the switching circuit disclosed in U.S. patent application Ser. No. 17/356,766, filed Jun. 24, 2021, the disclosure of which is herein incorporated by reference.

Importantly, it has been found that the accuracy of AoX algorithms is improved when the horizontal and vertical polarized signals from each antenna element are individually used. In other words, it may be beneficial to be able to select either the horizontal or vertical polarization from each antenna element in the antenna array. Furthermore, it is beneficial to minimize the phase difference between signals from different antenna elements.

Figure 5:
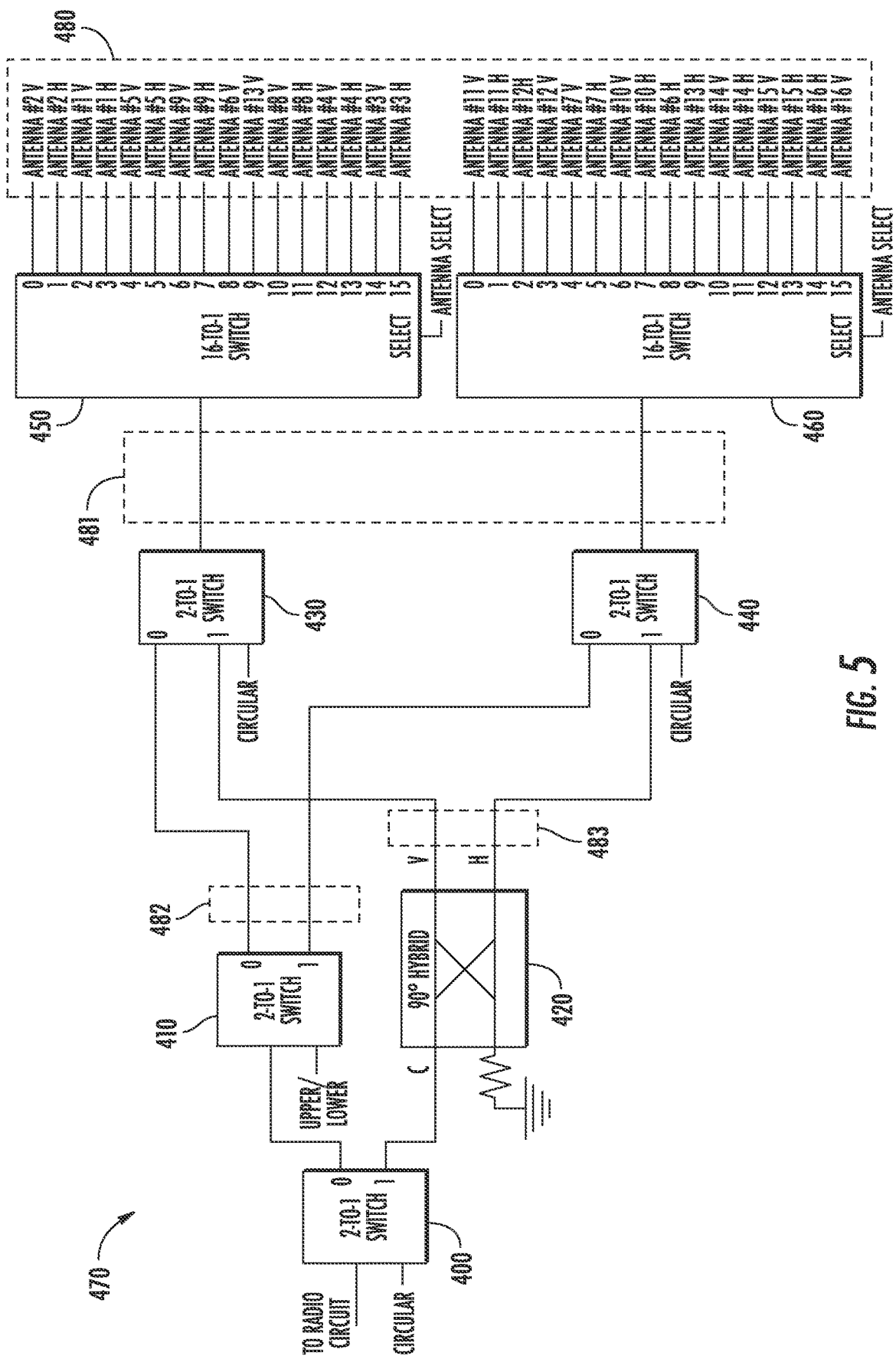
FIG. 5 shows a block diagram of the feeding circuit according to one embodiment.

This complex switching operation may be performed by a feeding circuit. FIG. 5 shows a representative block diagram of the feeding circuit 470. In this figure, it is assumed that there are 16 antenna unit cells 10, each configured to transmit and receive both horizontal and vertical polarized signals. In other words, the switching network is adapted to receive a signal from one of the antenna unit cells 10, or to transmit a signal to one of the antenna unit cells 10.

An upper antenna selection switch 450 is used to select one of 16 antenna signals. In certain embodiments, the signals used for the upper antenna selection switch 450 may be based on printed circuit board routing considerations. For example, if the antenna array is arranged as a 4×4 array, most of the signals in communication with the upper antenna selection switch 450 may be from antenna unit cells 10 disposed in the top two rows of the antenna array 1. A lower antenna selection switch 460 is used to select one of 16 antenna signals. Again, the signals used for the lower antenna selection switch 460 may be based on printed circuit board routing considerations. For example, if the antenna array 38 is arranged as a 4×4 array, most of the signals in communication with the lower antenna selection switch 460 may be from antenna unit cells 10 disposed in the bottom two rows of the antenna array 1.

Upper antenna selection switch 450 and lower antenna selection switch 460 may be bidirectional switches. Thus, these switches may be used to receive signals from the antenna unit cells 10 and also transmit signals to the antenna unit cells 10. Thus, the upper and lower antenna selection switches act as multiplexers and demultiplexers, depending on the direction of the activity. For clarity, the side of the switches with multiple interfaces will be referred to as the demultiplexed signals and the side of the switches with a single interface will be referred to as the multiplexed signal.

For most antenna unit cells 10, the horizontal and vertical polarized signals for each antenna unit cells 10 may be in communication with the demultiplexed signals on same antenna selection switch (either upper antenna selection switch 450 or lower antenna selection switch 460). However, for at least one antenna unit cells 10, the horizontal and vertical polarized signals are in communication with the demultiplexed signals on different switches. In this particular illustration, the horizontal polarized signal from Antenna #6 is in communication with the demultiplexed signals on the lower antenna selection switch 460, while the horizontal polarized signal is in communication with the demultiplexed signals on the upper antenna selection switch 450. To accommodate this change, the vertical polarized signal from Antenna #13 is in communication with the demultiplexed signals on the upper antenna selection switch 450. Note that the signals from Antenna #6 are in communication with the demultiplexed signal labelled 8 on both switches. Similarly, the signals from Antenna #13 are in communication with the demultiplexed signal labelled 9 on both switches.

The particular antenna signal that is selected by these antenna selection switches is determined based on the select signals. For example, four binary signals may be used to select one of the 16 demultiplexed signals on these switches. In certain embodiments, these select signals, referred to as ANTENNA SELECT, may be provided by the processing unit. For all of the switches described herein, the control signals are used to allow one of the demultiplexed signals to be in communication with the multiplexed signal.

Note that the upper antenna selection switch 450 and the lower antenna selection switch 460 have sixteen inputs to accommodate two signals from each antenna unit cells 10 in the antenna array 1. If there are a different number of antenna unit cells 10 in the antenna array 1, the upper antenna selection switch 450 and lower antenna selection switch 460 may have a different number of inputs. For example, an antenna array arranged as a 4×2 array may utilize upper and lower antenna selection switches that had 8 inputs each.

The multiplexed signal from the upper antenna selection switch 450 is in communication with the multiplexed signal from the upper polarization switch 430. The upper polarization switch 430 is used to select between a circular polarized signal or a signal that is only polarized in one direction. Similarly, the multiplexed signal from the lower antenna selection switch 460 is in communication with the multiplexed signal from the lower polarization switch 440. The lower polarization switch 440 is used to select between a circular polarized signal or a signal that is only polarized in one direction. A signal, referred to as CIRCULAR, is used to select between these modes. This CIRCULAR signal may be provided by a processing unit.

The demultiplexed signals from the upper and lower polarization switches are in communication with a 90° hybrid 420 and the bank selector switch 410, respectively.

The bank selector switch 410 is used to select between the upper polarization switch 430 and the lower polarization switch 440. In certain embodiments, a signal, referred to as UPPER/LOWER is used to select between the two polarization switches. This UPPER/LOWER signal may be provided by the processing unit.

The 90° hybrid 420 is configured such that when horizontal and vertical polarized signals are presented at the two signals on the right side of the device, a circular polarized signal is produced on the left side. Similarly, if a circular polarized signal is presented on the left side of the device, a horizontal polarized signal and a vertical polarized signal are generated on the right side of the device.

The multiplexed signal from the bank selector switch 410 is in communication with a first demultiplexed signal from the main polarization switch 400. Additionally, the 90° hybrid 420 is in communication with a second demultiplexed signal from the main polarization switch 400. The main polarization switch 400 is also controlled by the CIRCULAR signal, described above.

Thus, in summary, the switching network utilizes six signals (the ANTENNA SELECT signals, the CIRCULAR signal and the UPPER/LOWER signal) to select between the vertical polarized signal of any of the 16 antenna unit cells 10, the horizontal polarized signal of any of the 16 antenna unit cells 10, and the circular polarized of at least one of the antenna unit cells 10. FIG. 6 illustrates the operation of the feeding circuit 470.

Note that when CIRCULAR is set to zero, it is possible to select each of the 16 antenna unit cells 10 in either horizontal or vertical polarization mode. Further, when CIRCULAR to set to 1, it is possible to select antenna #6 or antenna #13 in circular mode.

Thus, through the use of a single 90° hybrid and three additional switches (i.e. the main polarization switch 400, the upper polarization switch 430 and the lower polarization switch 440), it is possible to generate and receive at least one circular polarized signal from the antenna array 1. Further, note that the circular polarized signal is generated from one or more of the antenna unit cells 10 in the antenna array 1 and does not require an additional antenna, separate from the antenna array 1.

Additionally, each signal from an antenna unit cell 10 is in communication with exactly one signal on either the upper antenna selection switch 450 or lower antenna selection switch 460. Therefore, it may be possible to match the lengths of each signal so that the phase delay associated with each antenna unit cell 10 is the same.

Note that FIG. 5 allows only antenna #6 and antenna #13 to be used for circular polarization. However, the disclosure is not limited to this embodiment. For example, if it was desired that four antenna unit cells are needed to be operable in circular polarization mode, the horizontal polarization of a third antenna element may be moved from the upper antenna selection switch 450 to the lower antenna selection switch 460 and replaced with the vertical polarization of a fourth antenna unit cells in the lower antenna selection switch 460 that is located in the same position as the horizontal polarization of the third antenna unit cell. For example, if the horizontal polarization of antenna #1 is moved to the lower antenna selection switch 460, the vertical polarization of antenna #12 would be used to replace it. In one particular embodiment, the vertical polarizations of all antenna unit cells 10 are in communication with the upper antenna selection switch 450 and the horizontal polarizations of all of the antenna unit cells 10 are in communication with the corresponding demultiplexed signals on the lower antenna selection switch 460. However, in certain embodiments, the routing of the signals from the antenna array 1 may make this configuration difficult to achieve.

In certain embodiments, all of the signal traces associated with the feeding circuit 470 are disposed on the bottom layer of the printed circuit board. FIG. 7 shows a cross-section of the printed circuit board 500. In one embodiment, the printed circuit board 500 includes six signal layers, where dielectric material is disposed between each pair of adjacent signal layers.

Figure 14:
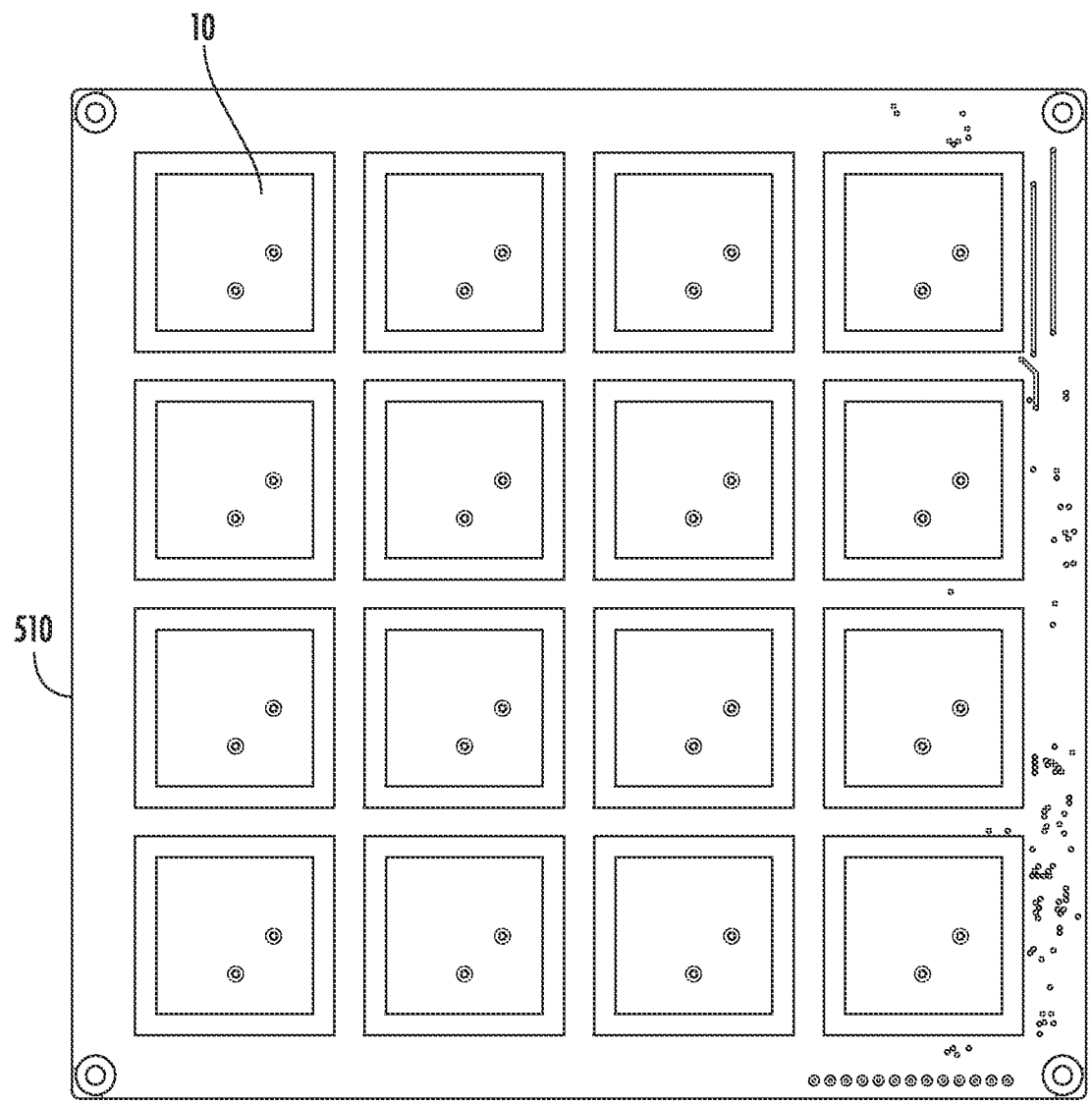
FIG. 14 shows the top layer of the printed circuit board.

As shown in FIG. 14, the patch antennas of the antenna unit cells 10 are disposed on the top layer 510. The second layer 520 is the RIS layer described with respect to FIGS. 1-4, and is also labelled IM1 RIS. Two signal layers 530, 540 may be beneath the RIS layer 60. The fifth signal layer is a ground layer 550 and is labelled IM4 GND. The bottom layer 560 is a signal layer that is used for routing the feeding circuit 470. Importantly, the top layer 510 and the RIS layer 60 are adjacent and the ground layer 550 and the bottom layer 560 are adjacent. There may be more or fewer layers between the RIS layer 60 and the ground layer 550. In other words, while a 6 layer printed circuit board is shown, the printed circuit board 500 may be any number of layer greater than or equal to four. In other words, the stackup includes a top layer, a RIS layer, zero or more intermediate layers, a ground layer 550 and a bottom layer 560.

To mitigate the unwanted radiation of the signal traces, it is desirable to reduce the thickness of the dielectric material 555 between the bottom layer 560 and the ground layer 550 (IM4 GND) as much as possible, as this will increase the coupling between the signal traces and the ground layer 550. However, since the stackup of the printed circuit board 500 needs to be symmetric to avoid the warping, the thickness of the dielectric material 515 between the top layer 510 and RIS layer 60 (the second layer 520) should be the same.

On the other hand, the gap between the patch antennas 20 and their respective metamaterial structures 70 cannot be too small; in that case, it will become impossible to tune the antennas correctly. Additionally, reducing the thickness of dielectric material 515 also reduces the radiation efficiency. A tradeoff is needed; simulations showed that the 0.2 mm thickness of the dielectric material 515 may be the most optimal. In that case, the coupling between the neighboring traces on the bottom layer 560 is still sufficiently small (less than −20 dB), while the performance of the antenna unit cells is still acceptable.

Figure 8:
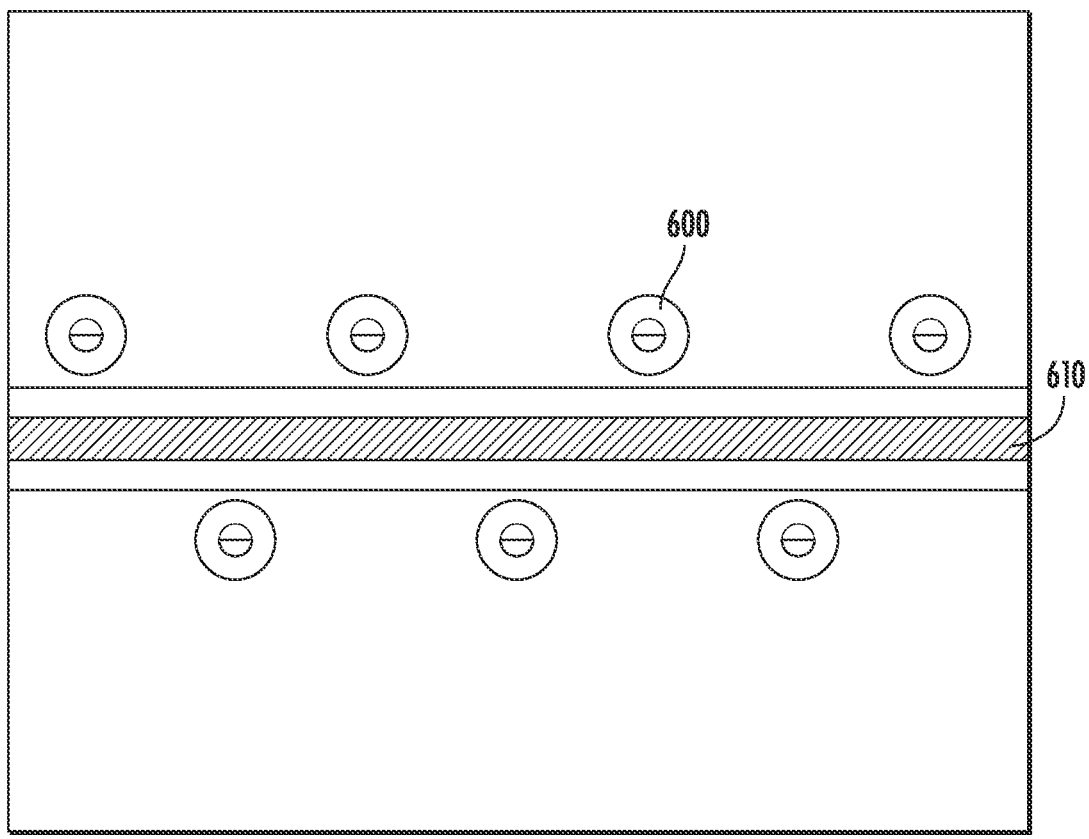
FIG. 8 shows a coplanar waveguide that may be used on the bottom layer of the printed circuit board.

Another important consideration is the signal traces on the bottom layer 560 as this has an impact on radiation and coupling. One option is the use of coplanar waveguide (as shown on FIG. 8). In this embodiment, the shielding vias 600 around the signal traces 610 are blind vias, that only pass between the ground layer 550 and the bottom layer 560 so that they do not interfere with any components (especially the patch antennas and the metamaterial structures) above the ground layer 550, which may be the fifth layer. In other words, the shielding vias 600 only travel from the bottom layer 560 to the ground layer 550. These shielding vias 600, along with the ground filling on the bottom layer 560 around the signal traces, creates an even stronger coupling between the signal traces and the ground layer 550 on the fifth signal layer, further mitigating unwanted radiations and couplings.

The spacing between the signal traces on the bottom layer 560 is also critical from the point of view of coupling. The further the signal traces are from each other, and the shorter parallel sections they have, the more the coupling between them is mitigated. In this design, the signal traces are spread out on the entire bottom layer 560 of the printed circuit board 500 as evenly and as much as possible, thus increasing the spacing between the signal traces. Also, except for the region in close proximity to the upper antenna selection switch 450 and the lower antenna selection switch 460, there is enough space between every pair of signal traces, so that at least one row of shielding vias 600 can be placed between them, contributing to the isolation of the signal traces significantly.

Having covered the design principles related to the signal traces in the feeding circuit 470, the next topic is phase balancing. Since this antenna array 1 is used to determine the arrival or departure angle of a wireless signal based on the phase differences between the received signals on different antenna unit cells 10, it is important that all the signal traces from the RF input to the patch antennas of the various antenna unit cells 10 are equalized in length. Otherwise, the signal traces may introduce phase errors, which, in turn would corrupt the phase difference data, and falsify the measured angle value.

It is also important to equalize the lengths signal traces entering the 90° hybrid 420, as failing to do so would distort the circular polarization of the radiated signal, making the receiving antenna less sensitive to one polarization than the orthogonal polarization.

FIG. 5 identifies four distinct sets of signals traces. The first set 480 represents thirty-two signal traces; sixteen are the signal traces between the upper antenna selection switch 450 and the antenna unit cells 10; the other sixteen are the signal traces between the lower antenna selection switch 460 and the antenna unit cells 10. The thirty-two signal traces in this first set 480 may be identical in length. In certain embodiments, the lengths of all of the signal traces in the first set 480 are within 1.5 mm of each other. This maximum difference in length is referred to as the tolerance.

The second set 481 represents two signal traces; one is the signal trace between the upper antenna selection switch 450 and upper polarization switch 430; the second is the signal trace between the lower antenna selection switch 460 and lower polarization switch 440. The two signal traces in this second set 481 may be identical in length. In certain embodiments, the difference in length between these two traces is less than 1.5 mm. However, these two signal traces do not need the same length as the signal traces in the first set 480.

The third set 482 represents two signal traces; one is the signal trace between the bank selector switch 410 and upper polarization switch 430; the second is the signal trace between the bank selector switch 410 and lower polarization switch 440. The two signal traces in this third set 482 may be identical in length. In certain embodiments, the difference in length between these two traces is less than 1.5 mm. However, these two signal traces do not need the same length as the signal traces in the first set 480 or the second set 481.

The fourth set 483 represents two signal traces; one is the signal trace between the 90° hybrid 420 and upper polarization switch 430; the second is the signal trace between the 90° hybrid 420 and lower polarization switch 440. The two signal traces in this second set 481 may be identical in length. In certain embodiments, the difference in length between these two traces is less than 3 mm. However, these two signal traces do not need the same length as the signal traces in the first set 480, the second set 481 or the third set 482.

Figure 9:
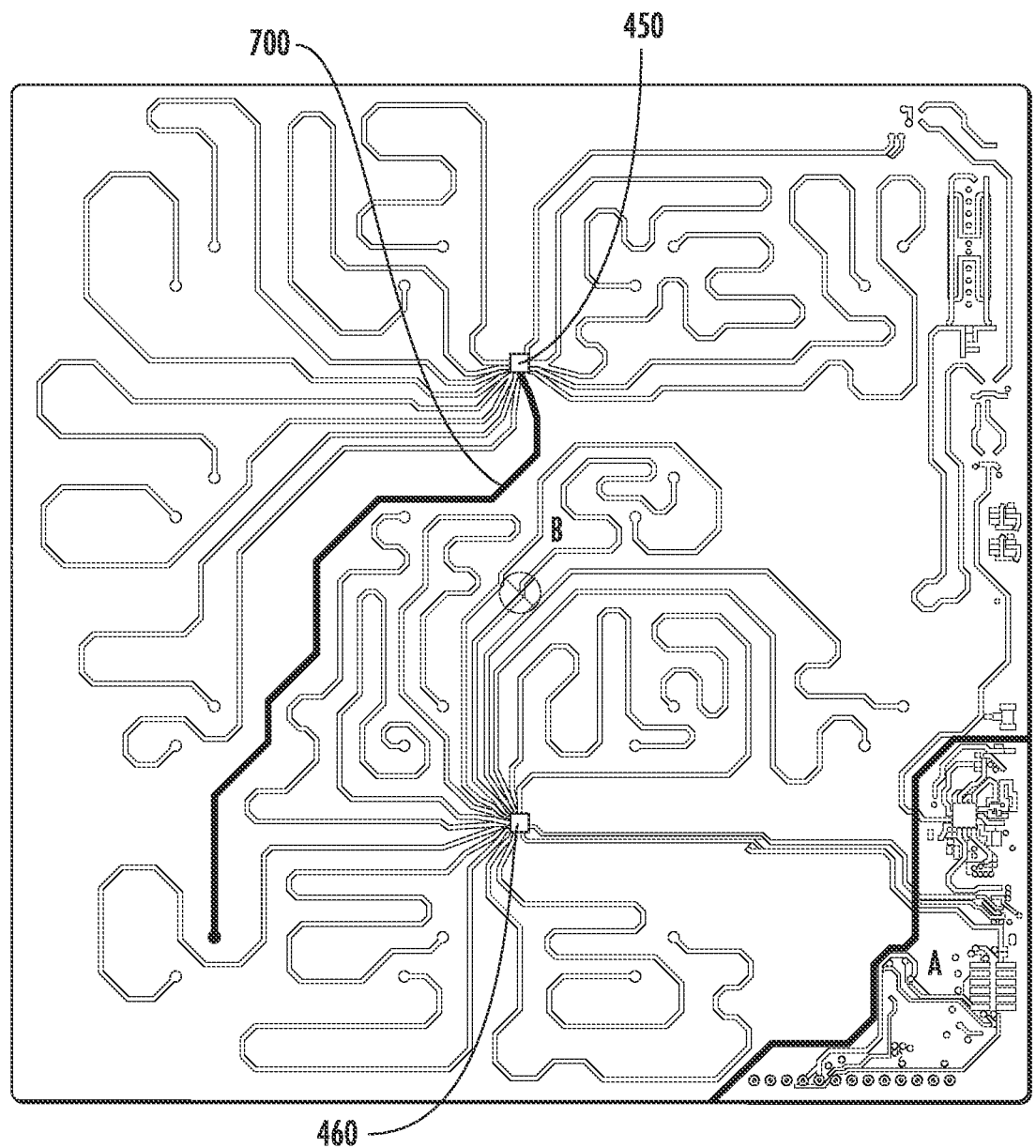
FIG. 9 shows the longest signal trace in the first set of signal traces.

FIG. 9 shows the bottom layer 560 of the printed circuit board 500, wherein the longest trace 700 in the first set 480 is highlighted. The first set 480 includes the thirty two signal traces that are in communication with the lower antenna selection switch 460 and upper antenna selection switch 450. The length of the longest trace 700 establishes the length that all the other 31 signal traces in the first set 480 should be. Since the other signal traces are shorter, meanders and loops are added to these signal traces to increase their lengths. The part of the bottom layer 560 labelled A is associated with other circuitry and is not part of the feeding circuit 470.

Figure 10:
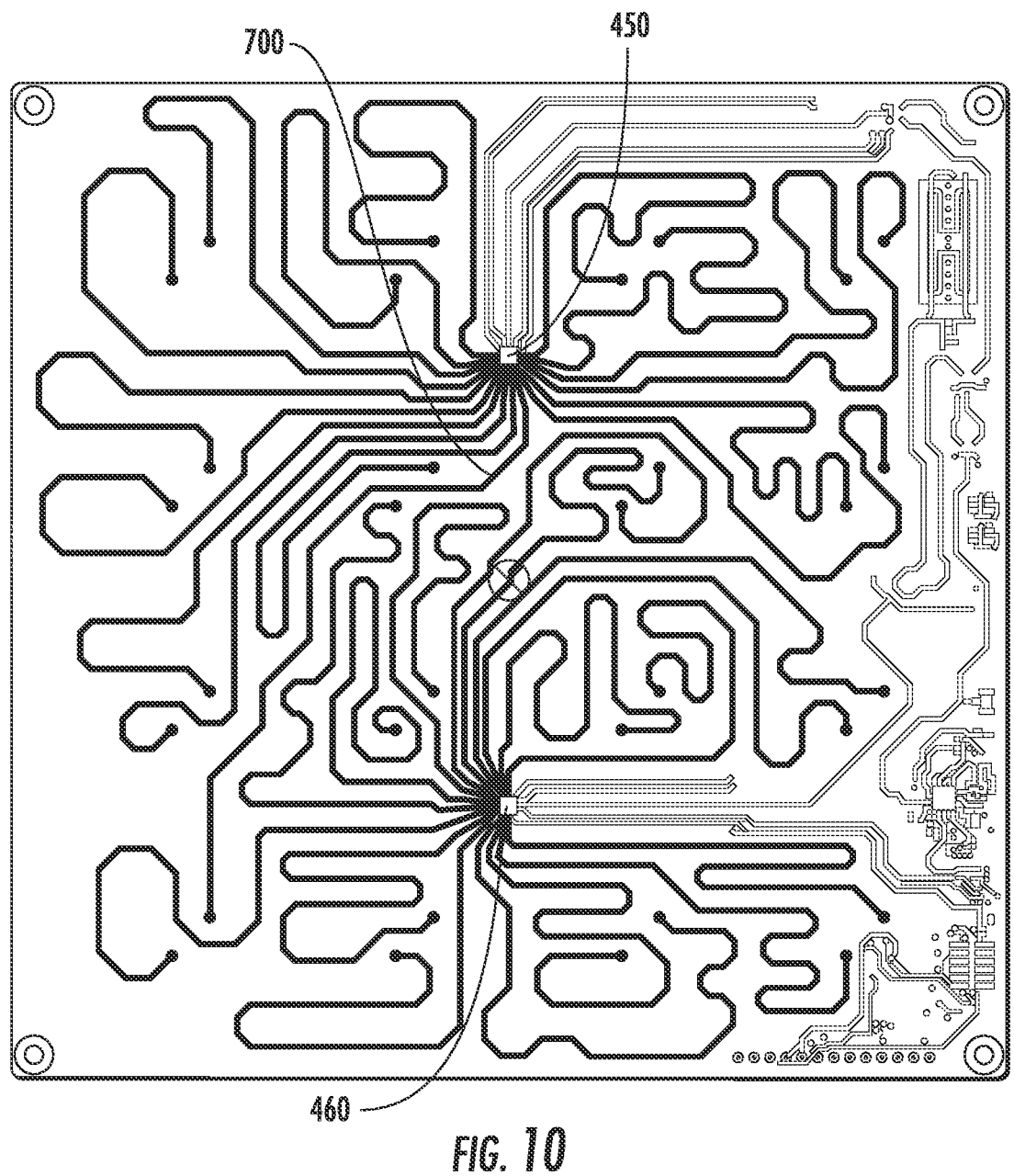
FIG. 10 shows all of the signal traces in the first set of signal traces.

FIG. 10 shows the 32 signal traces of the first set 480 highlighted. Note that many of these signal traces have meanders and loops, also referred to as tortuous paths. By introducing these meanders, loops and curves, the lengths of these other signal traces can be increased. In addition, the parallel sections of each pair of signal traces are kept as far from each other as possible, to reduce crosstalk. In this way, the lengths of all of the signal traces in the first set 480 are within 1.5 mm of each other.

Figure 11:
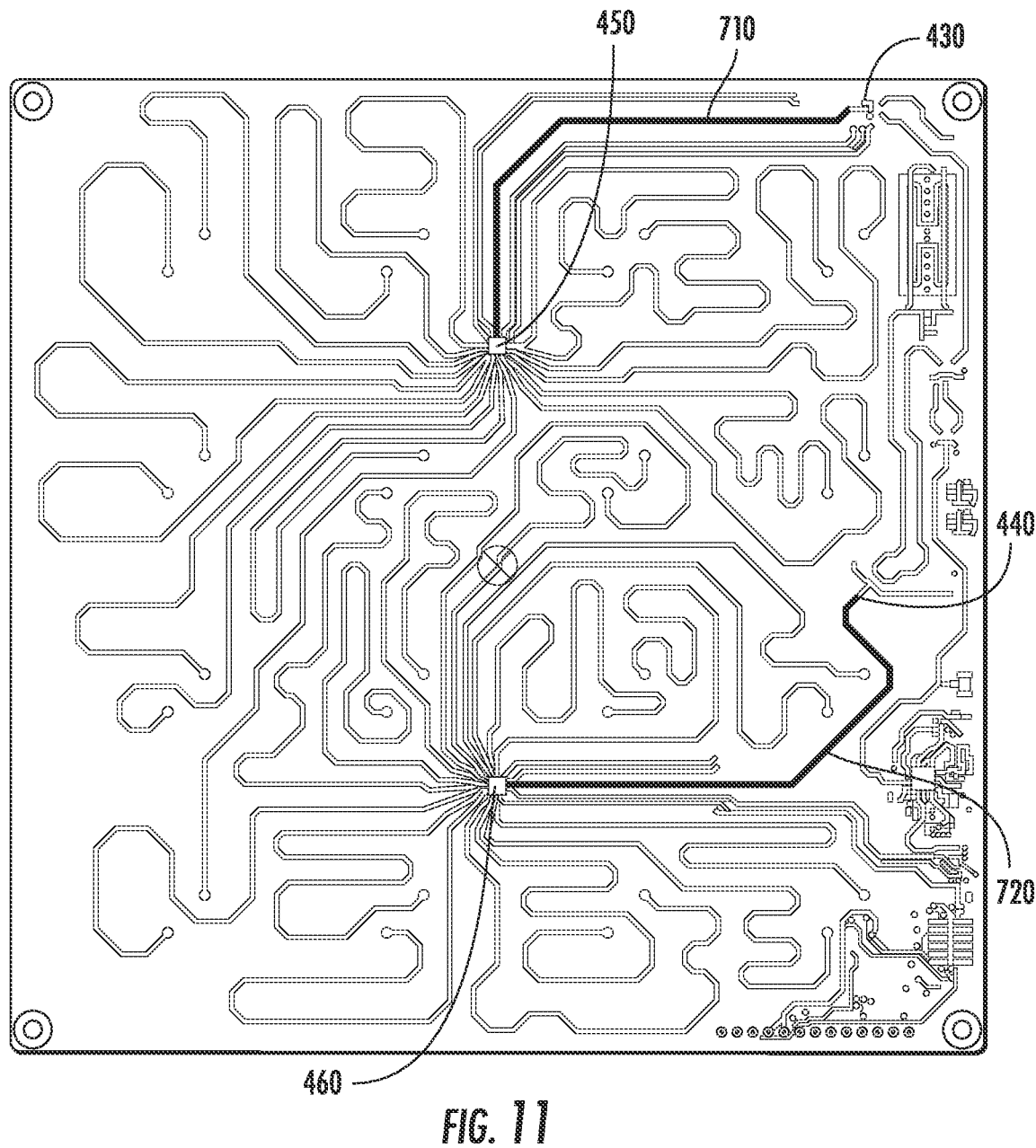
FIG. 11 shows the two signal traces in the second set of signal traces.

FIG. 11 shows the two signal traces of the second set 481. Signal trace 710 traverses the bottom layer 560 from the upper antenna selection switch 450 to the upper polarization switch 430. Signal trace 720 traverses the bottom layer 560 from the lower antenna selection switch 460 to the lower polarization switch 440. Signal trace 710 requires the longest path, so a slightly tortuous path is used for the signal trace 720. The difference in length between signal trace 710 and signal trace 720 is less than 1.5 mm.

Figure 12:
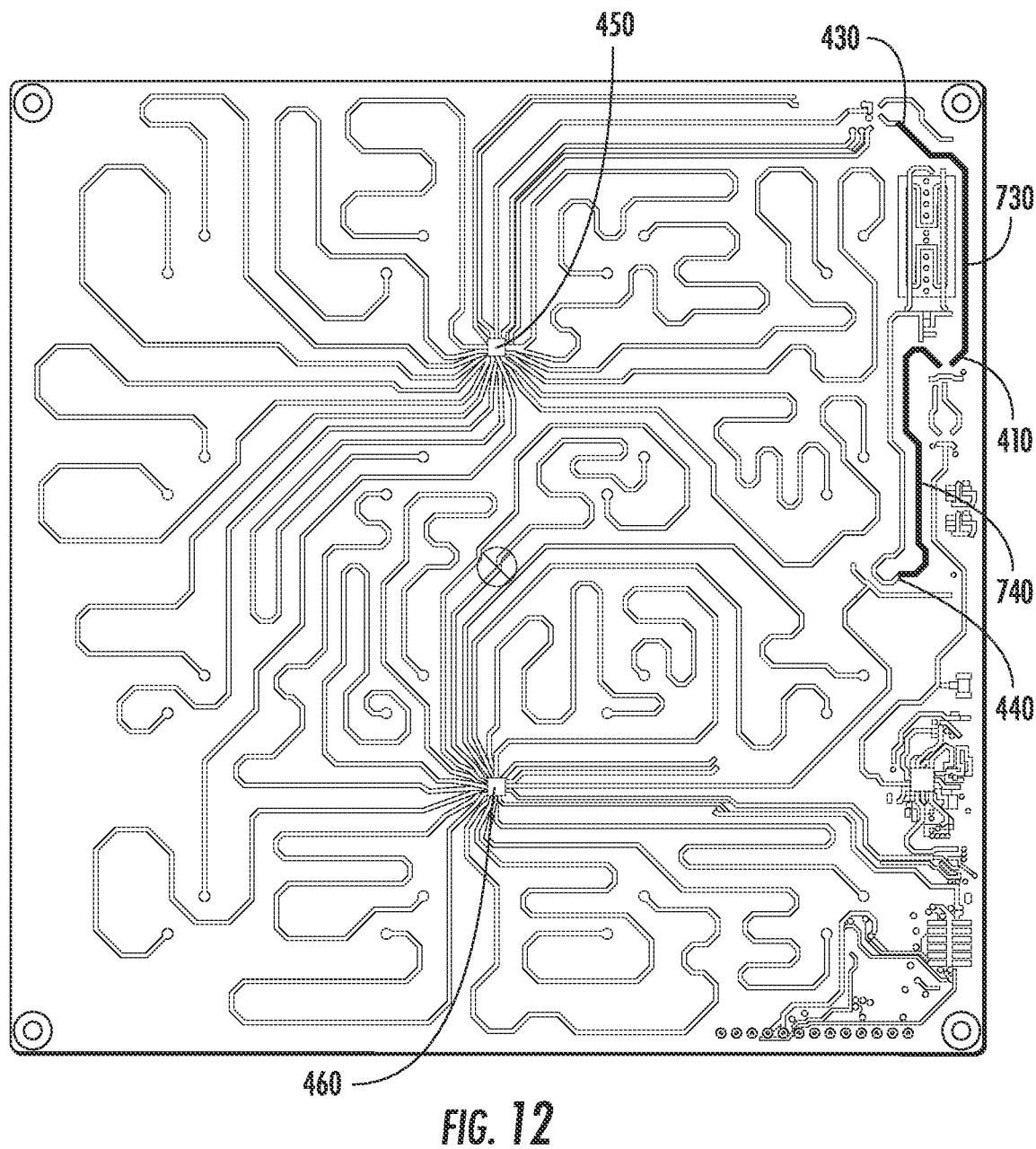
FIG. 12 shows the two signal traces in the third set of signal traces.

FIG. 12 shows the two signal traces of the third set 482. Signal trace 730 traverses the bottom layer 560 from the upper polarization switch 430 to bank selector switch 410. Signal trace 740 traverses the bottom layer 560 from the lower polarization switch 440 to bank selector switch 410. Signal trace 730 requires the longest path, so a slightly tortuous path is used for the signal trace 730. The difference in length between signal trace 730 and signal trace 740 is less than 1.5 mm.

Note that the first set 480, the second set 481 and the third set 482 comprise all of the signals needed to connect the antenna unit cells to the main polarization switch 400. Thus, these sets of signal traces should be optimized before addressing the signal traces in the fourth set 483. Furthermore, preferably, all of the signal traces in these three sets should be completely disposed on the bottom layer 560 of the printed circuit board 500.

Further, while it is preferable that the signal traces in the second set 481 are identical in length and the signal traces in the third set 482 are also identical in length, other embodiments are possible. For example, in another embodiment, the combined length of signal trace 710 plus signal trace 730 should equal the combined length of signal trace 720 plus signal trace 740.

Additionally, it is noted that the phase change of a signal is determined by the total signal trace length from the bank selector switch 410 to the respective antenna ports. In other words, each port of each antenna has an associated path from the antenna, through one of the antenna selection switches, through one of the polarization switches and to the back selector switch. Thus, the total length of the path includes one signal trace from the first set 480, one signal trace from the second set 481 and one signal trace from the third set 482. In certain embodiments, the maximum difference between the total length from two antenna ports to the bank selector switch 410 may be 1.5 mm. This corresponds to a 5° phase difference in the frequency range of interest.

This total tolerance of 1.5 mm may be divided between the first set 480, the second set 481 and the third set 482. For example, the signal traces in the first set 480 may vary by up to 1.5 mm. However, in this embodiment, the signal traces in the second set 481 must be the same length and the signal traces in the third set 482 must also be the same length. In another embodiment, the signal traces in the first set 480 may vary by up to 1.0 mm. In this embodiment, the tolerance of the second set 481 and the tolerance of the third set 482 must sum up to 0.5 mm. For example, the lengths of the two signal traces in the second set 481 may differ by up to 0.3 mm, while the lengths of the two signal traces in the third set vary by up to 0.2 mm. In another embodiment, the tolerance of 1.5 mm may be divided equally between the first set 480, the second set 481 and the third set 482.

Figure 13:
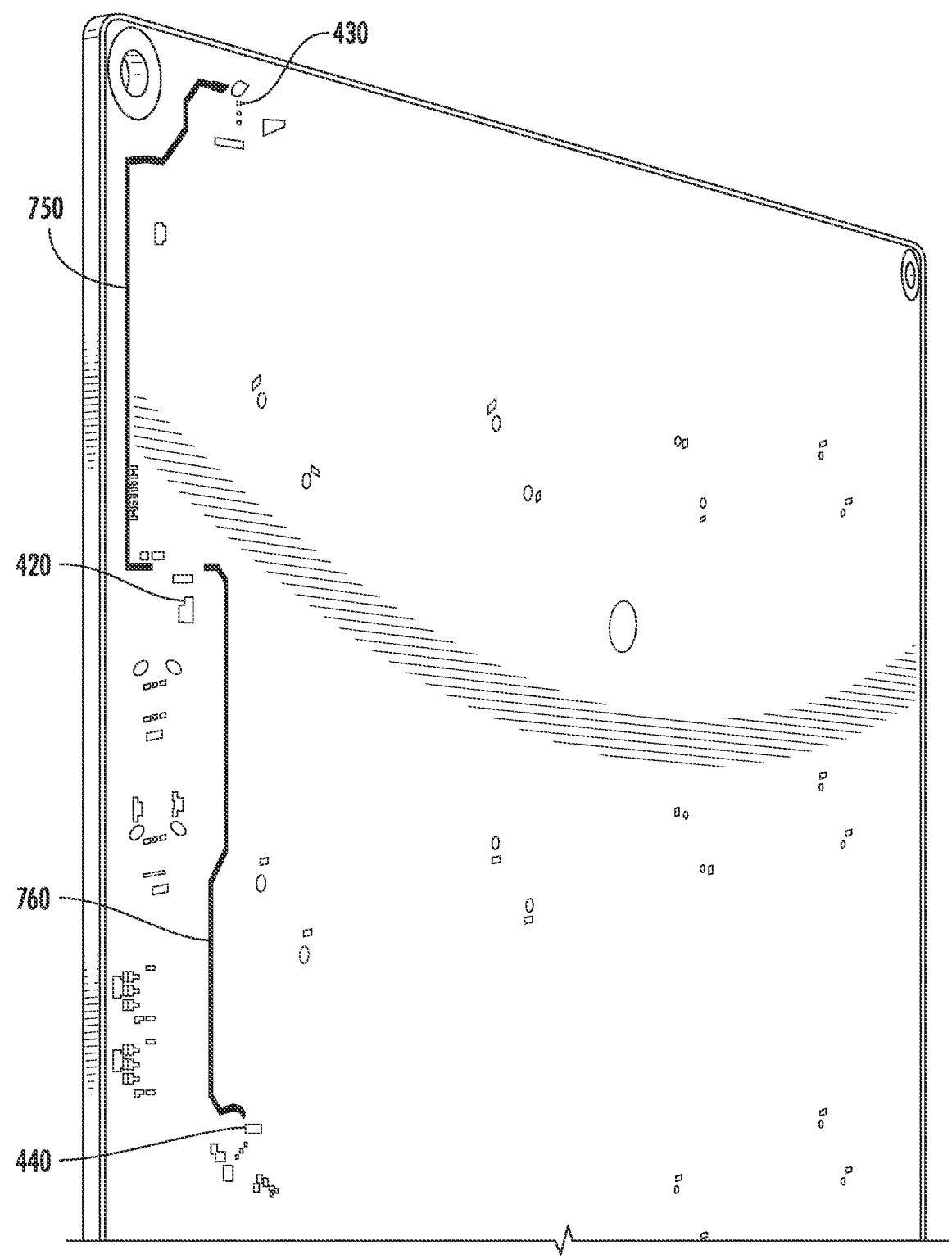
FIG. 13 shows the two signal traces in the fourth set of signal traces.

Finally, the signal traces for the fourth set 483 should also be equal in length. In some embodiments, these two signal traces are also disposed on the bottom layer 560 of the printed circuit board 500. However, if it is not possible to route these signals on the bottom layer 560, these can be routed on a different signal layer, such as the top layer 510. This is shown in FIG. 13, wherein signal trace 750 traverses the top layer 510 from the upper polarization switch 430 to 90° hybrid 420 and signal trace 760 traverses the top layer 510 from the lower polarization switch 440 to 90° hybrid 420. Using the top layer 510 for routing required two via interconnections on that signal trace, and the lengths of those vias should be taken into consideration when equalizing the two signal traces. In certain embodiments, the difference in length between signal trace 750 and signal trace 760 is less than 3 mm. This corresponds to a 10° phase difference in the frequency range of interest. Though inserting the vias in an RF trace has undesirable side effects, fortunately in circularly polarized mode, the small phase error introduced by the vias has a negligible effect on the operation of the system.

The feeding circuit 470 described herein has phase balanced signal traces between the antenna selection switches and the different antenna ports in small array sizes. In the 4×4 dual fed antenna array shown herein, there are a total of 32 signal traces in the first set of signal traces, but the system and method are applicable for other numbers of array antennas and signal traces as well. To achieve the phase balance, a reference trace length is chosen based on the longest distance between an antenna selection switch and an associated antenna port. The other signal traces in the first set of signal traces may also have also the same reference length but are folded and meandered to achieve this reference length.

The feeding circuit 470 also comprises a 90° hybrid for the circularly polarized signal generation. The signal traces leading to the 90° hybrid (i.e. the fourth set of signal traces) are designed so that they maintain its 90° phase shift between its outputs.

The present system has many advantages.

The feeding circuit 470 yields reduced coupling between the first set of signal traces by minimizing the parallel sections between the neighboring traces and by using coplanar traces with ground fill between them with massive shielding vias on both ground sides. For example, in one embodiment, there are no parallel sections between neighboring traces that are longer than 4 inches. A massive ground layer is disposed in the next intermediate layer to connect the shielding vias in short ground return route. The dielectric thickness between the bottom layer and ground layer is minimized (as allowed by the array build-up) to reduce the couplings further, especially around the antenna selection switches. These layout solutions also reduce the unwanted radiations of the signal traces.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A printed circuit board, comprising:
a top layer;
a ground layer;
a bottom layer directly adjacent to the ground layer;
an antenna array, comprising a plurality of antenna unit cells, each antenna unit cell having a patch antenna disposed on the top layer; and
a feeding circuit, comprising:
an upper antenna selection switch and a lower antenna selection switch, wherein a first set of signal traces are used to connect a horizontal polarized signal and a vertical polarized signal of each antenna unit cells;
upper polarization switch and a lower polarization switch, wherein a second set of signal traces are used to connect the upper antenna selection switch and the upper polarization switch and to connect the lower antenna selection switch and the lower polarization switch; and
a bank selection switch, wherein a third set of signal traces are used to connect the bank selection switch to the upper polarization switch and to the lower polarization switch.

2. The printed circuit board of claim 1, wherein the first set of signal traces are routed on the bottom layer and a length of each signal trace in the first set of signal traces is within 1.5 mm of each other.

3. The printed circuit board of claim 2, wherein one signal trace in the first set of signal traces has a longest length and other signal traces in the first set of signal traces have a tortuous path to achieve the longest length.

4. The printed circuit board of claim 2, wherein parallel sections between adjacent traces in the first set of signal traces are minimized to reduce coupling.

5. The printed circuit board of claim 1, wherein the second set of signal traces are routed on the bottom layer and a length of each signal trace in the second set of signal traces is within 1.5 mm of each other.

6. The printed circuit board of claim 1, wherein the third set of signal traces are routed on the bottom layer and a length of each signal trace in the third set of signal traces is within 1.5 mm of each other.

7. The printed circuit board of claim 2, wherein shielding vias are disposed on each side of the signal traces in the first set of signal traces.

8. The printed circuit board of claim 7, wherein the shielding vias are blind vias that only pass from the bottom layer to the ground layer.

9. The printed circuit board of claim 1, wherein the feeding circuit further comprises a 90° hybrid, wherein a fourth set of signal traces are used to connect the upper polarization switch and the lower polarization switch to the 90° hybrid.

10. The printed circuit board of claim 9, wherein a length of each signal trace in the fourth set of signal traces is within 3 mm of each other.

11. The printed circuit board of claim 9, wherein the fourth set of signal traces are routed at least partly on the top layer.

* * * * *